United States Patent
Chen et al.

(10) Patent No.: US 8,604,359 B2
(45) Date of Patent: Dec. 10, 2013

(54) PACKAGE SUBSTRATE AND FABRICATION METHOD THEREOF

(75) Inventors: Tsung-Yuan Chen, Taoyuan County (TW); Shih-Lian Cheng, Taoyuan County (TW)

(73) Assignee: Unimicron Technology Corp., Kwei-San Industrial Zone, Taoyuan (TW)

( * ) Notice: Subject to any disclaimer, the term of this patent is extended or adjusted under 35 U.S.C. 154(b) by 47 days.

(21) Appl. No.: 13/241,264

(22) Filed: Sep. 23, 2011

(65) Prior Publication Data

US 2012/0312584 A1    Dec. 13, 2012

(30) Foreign Application Priority Data

Jun. 9, 2011   (TW) .................................. 0120097 A

(51) Int. Cl.
 *H05K 1/11*   (2006.01)
(52) U.S. Cl.
 USPC ............................ 174/262; 174/260; 174/261

(58) Field of Classification Search
 None
 See application file for complete search history.

(56) References Cited

U.S. PATENT DOCUMENTS

| | | | | |
|---|---|---|---|---|
| 7,382,057 | B2 * | 6/2008 | Hsu .............................. | 257/778 |
| 8,143,531 | B2 * | 3/2012 | Miki et al. .................... | 174/260 |
| 8,319,115 | B2 * | 11/2012 | Ohsumi ........................ | 174/260 |
| 2010/0071950 | A1 | 3/2010 | Ohsumi | |
| 2010/0294552 | A1 * | 11/2010 | Kobayashi et al. ........... | 174/260 |

\* cited by examiner

*Primary Examiner* — Ishwarbhai Patel

(74) *Attorney, Agent, or Firm* — Winston Hsu; Scott Margo

(57) ABSTRACT

A package substrate includes a core board, a first dielectric layer, a second circuit pattern, a first solder mask and an insulating layer. A first circuit pattern is disposed on a first surface of the core board. The first dielectric layer covers the first circuit pattern. The second circuit pattern is located on the first dielectric layer and the second circuit pattern includes an interconnection circuit pattern within a chip mounting area. The first solder mask covers a portion of the second circuit pattern outside the chip mounting area. The insulating layer covers the chip mounting area and the interconnection circuit pattern. A plurality of embedded bump pads are located on an upper surface of the insulating layer.

6 Claims, 5 Drawing Sheets

PACKAGE SUBSTRATE AND FABRICATION METHOD THEREOF

BACKGROUND OF THE INVENTION

1. Field of the Invention

The present invention relates generally to a package substrate and fabrication method thereof, and more specifically, to a package substrate and fabrication method thereof that forms an interposer and internal circuits on the surface of the substrate.

2. Description of the Prior Art

For the needs of achieving miniature sizes and high density in semiconductor packages, a three dimensional package technology such as through-silicon via (TSV) package technology is developed. Through-silicon via (TSV) package technology can effectively increase the three dimensional density, enabling the growing rate of semiconductor industry to exceed Moore's law. The level of through-silicon via (TSV) package technology is L/S (line width/line pitch) being less than 6/6. The cost of using a silicon substrate is four times that of using a flip chip ball grid array (FCBGA) substrate.

In consideration of the cost, there is a need in this industry to apply the FCBGA package technology in the art of three-dimensional packages to replace expensive TSV package technology. However, some problems will occur. First, present semi-additive process (SAP) still can not form these package products with a line-space scale of L/S<6/6. Second, the difference in the thermal expansion coefficient (CTE) of dielectrics applied in the IC carrier industry and the silicon substrate is too large, thereby the problem of reliability may occur. Otherwise, the layout of ultra high density interposer would be retrained by the processing limitation of solder resist opening(SRO)>65 um. Based on the current level of technology, the dimension of a blind hole in a substrate needs to be larger than 40 µm, thus circuit layout space may be wasted.

Therefore, a package substrate and fabrication method thereof, that can solve the aforesaid problems, is needed in the industry.

SUMMARY OF THE INVENTION

The present invention provides a package substrate and fabrication method thereof, that combines a laser embedded (LE) process, a thermal curing dielectric (TCD) process and a chemical mechanical polishing (CMP) process to fabricate interposers and internal circuits on the surface of the substrate for solving said processing limitation of package technology and enhancing the integration of package substrates.

The present invention provides a package substrate, including a core board, a first dielectric layer, a second circuit pattern, a first solder mask and an insulation layer. The core board has a first circuit pattern on its first surface. The first dielectric layer covers the first circuit pattern. The second circuit pattern is disposed on the first dielectric layer and the second circuit pattern includes an interconnect circuit pattern located in a chip mounting area. The first solder mask covers the second circuit pattern outside the chip mounting area. The insulation layer covers the chip mounting area and the interconnect circuit pattern. A plurality of embedded bump pads are disposed in a top surface of the insulation layer. One of the plurality of embedded bump pads is electrically connected to the interconnect circuit pattern through a via plug in the insulation layer. The embedded bump pads, the interconnect circuit pattern, the via plug, and the insulation layer constitute a fan-out interposer.

The present invention provides a method of fabricating a package substrate. A substrate including at least an inner-layer circuit pattern and at least an outer-layer circuit pattern is provided. The outer-layer circuit pattern includes an interconnect circuit pattern located within a chip mounting area. The substrate is covered with a solder mask that covers the outer-layer circuit pattern. The solder mask is removed from the chip mounting area to expose the interconnect circuit pattern. An insulation layer is formed inside the chip mounting area to cover the interconnect circuit pattern. Te insulation layer is cured. A plurality of embedded bump pads are formed in a top surface of the insulation layer.

The present invention provides a package substrate and fabrication method thereof, that uses an insulation layer having an embedded circuit pattern as an interposer formed in the substrate to replace the sub-substrate of through-silicon via (TSV) package technology of the prior art. Therefore, the problems of the prior art, such as the line width limitation leading to semi-additive process not being able to be used, the difference in dielectrics of package substrates and silicon substrates being too large and giving rise to bad reliability, the limitation of size shrinking of solder resist openings and too large openings of blind holes in substrates, can be solved, meaning the package substrate of the present invention has smaller sizes and better reliability.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
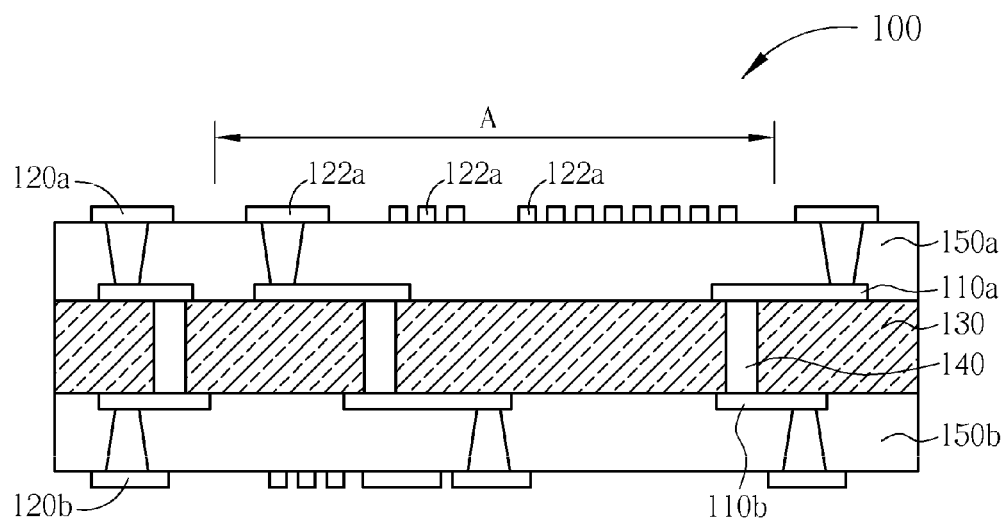
FIGS. 1-10 schematically depict a cross-sectional view of a fabrication method of a semiconductor package according to one preferred embodiment of the present invention.

FIGS. 1-10 schematically depict a cross-sectional view of a fabrication method of a semiconductor package according to one preferred embodiment of the present invention. A substrate 100 including inner-layer circuit patterns 110a and 110b and outer-layer circuit patterns 120a and 120b is provided. In this embodiment, the substrate 100 may include a four-layer substrate, but it may also be a six-layer substrate, or an eight-layer substrate, etc. The inner-layer circuit pattern 110 and the outer-layer circuit pattern 120 may be formed by the following steps, but they are not limited thereto.

As shown in FIG. 1, a core board 130 is provided. The core board 130 has at least a conductive via 140 to electrically connect the inner-layer circuit pattern 110a and the inner-layer circuit pattern 110b on the either side of the core board 130. The core board 130 may comprise prepreg or fiberglass-epoxy resin, but it is not limited thereto. The inner-layer circuit pattern 110a and the inner-layer circuit pattern 110b may include conductive materials such as copper. The conductive vias 140 may be formed by laser drilling, mechanical drilling or lithography process, etc.

A first dielectric layer 150a and a second dielectric layer 150b are respectively laminated on either sides of the core board 130, wherein the first dielectric layer 150a and the second dielectric layer 150b respectively cover the inner-layer circuit pattern 110a and the inner-layer circuit pattern 110b. The outer-layer circuit pattern 120a and the outer-layer circuit pattern 120b are respectively formed on the surface of the first dielectric layer 150a and the second dielectric layer 150b. In a preferred embodiment, the materials of the first dielectric layer 150a and the second dielectric layer 150b may be ajinomoto bond film (ABF) or other insulator materials. The materials of the outer-layer circuit pattern 120a and the outer-layer circuit pattern 120b may include conductive materials such as copper. It is worthy of being emphasized, the outer-layer circuit pattern 120a includes an interconnect circuit pattern 122a located in a chip mounting area A.

Figure 2:
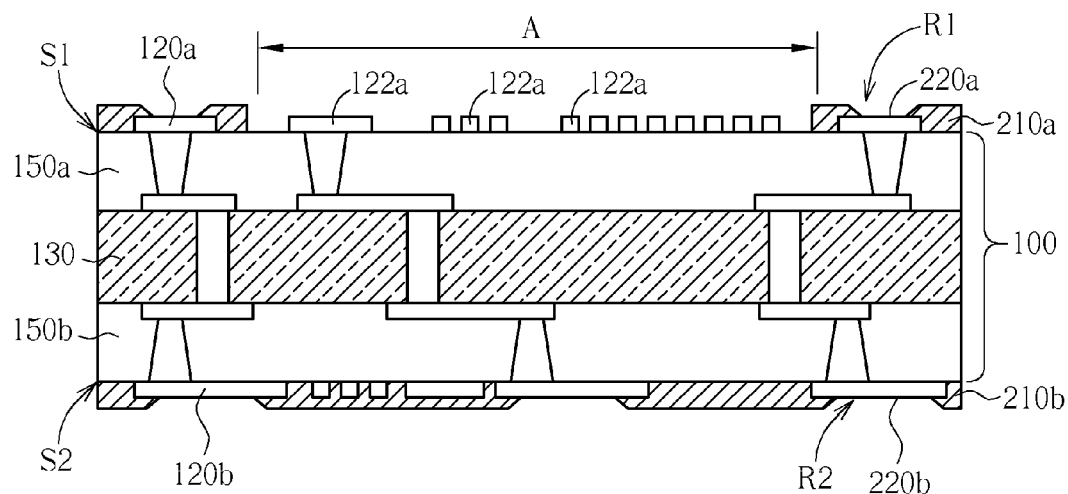

As shown in FIG. 2, solder masks 210a and 210b respectively cover either external surface S1 and S2 of the substrate 100, wherein the solder mask 210a covers the outer-layer circuit pattern 120a and the first dielectric layer 150a, and the solder mask 210b covers the outer-layer circuit pattern 120b and the second dielectric layer 150b. The solder mask 210a in the chip mounting area A of the external S1 is removed and the interconnect circuit pattern 122a is therefore exposed. A plurality of solder resist openings R1 may be formed in the solder mask 210a outside the chip mounting area A, and that exposes a plurality of bump pads 220a. Likewise, a plurality of solder resist openings R2 may be formed in the solder mask 210b on the external side S2, and that exposes a plurality of bump pads 220b. The solder mask 210a and the solder mask 210b may comprise epoxy, wherein the epoxy may include photosensitive resin, so that a lithography process can be directly performed on the solder mask 210a and the solder mask 210b, and the solder resist openings R1 and R2 can be respectively formed.

Figure 3:
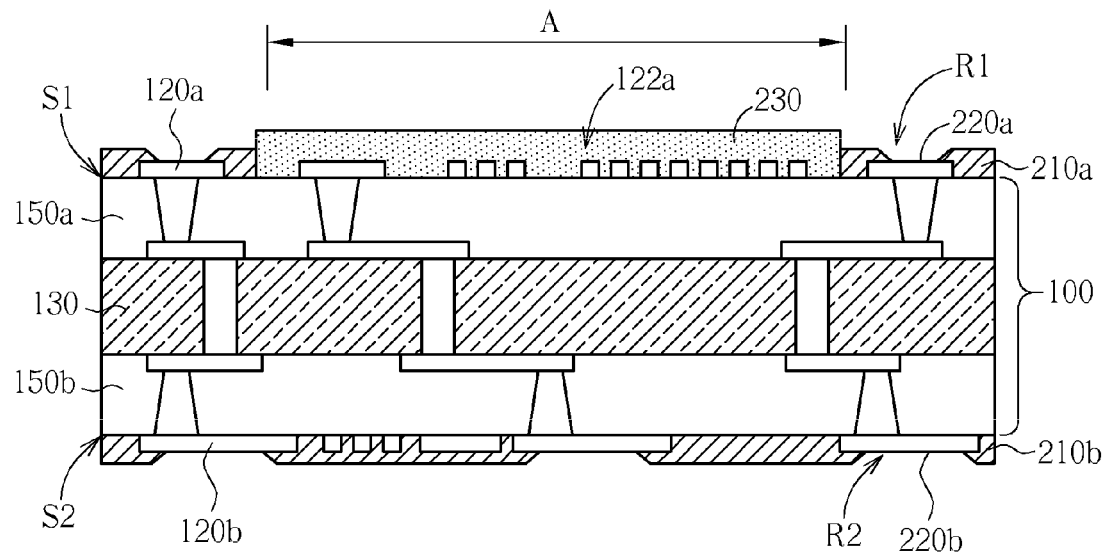

As shown in FIG. 3, an insulation layer 230 may be formed inside the chip mounting area A on the external surface S1 of the substrate 100 by coating or printing. For example, the insulation layer 230 may be a thermal curing dielectric (TCD), covering the interconnect circuit pattern 122a. A curing process is performed on the insulation layer 230. In a preferred embodiment, the insulation layer 230 directly contacts the first dielectric layer 150a. In a preferred embodiment, the insulation layer 230 does not overlap the solder mask 210a. In another embodiment, the insulation layer 230 may overlap the solder mask 210a.

Figure 4:
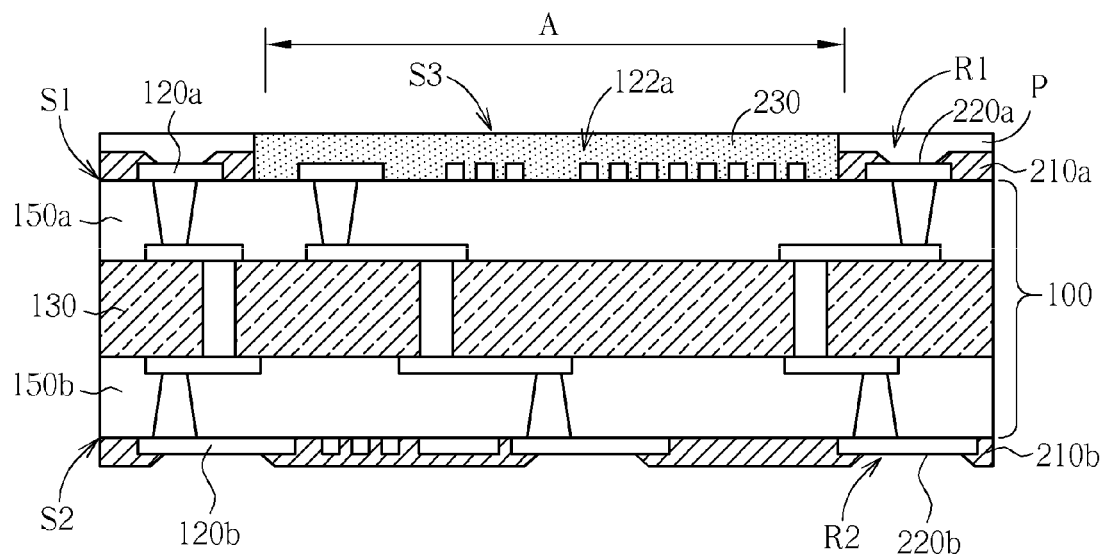
Figure 5:
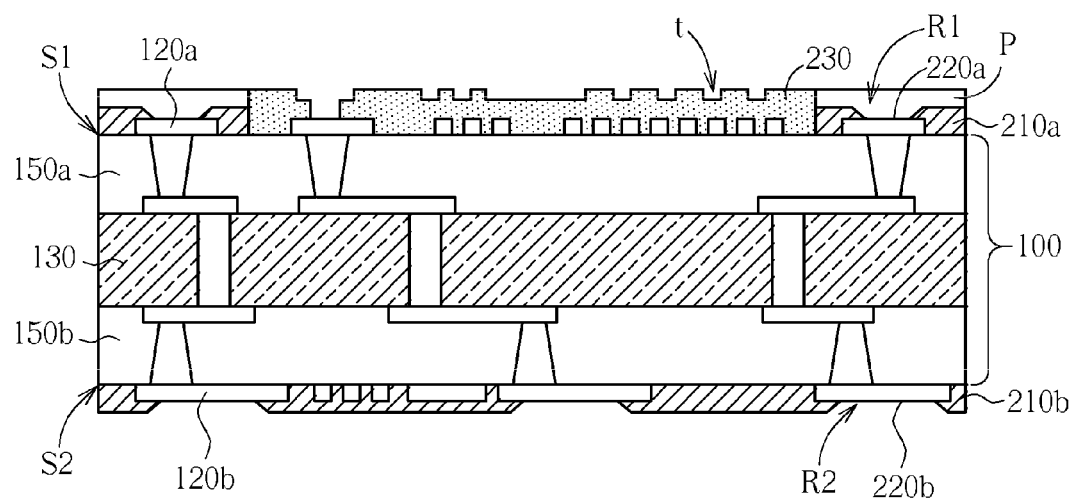
Figure 6:
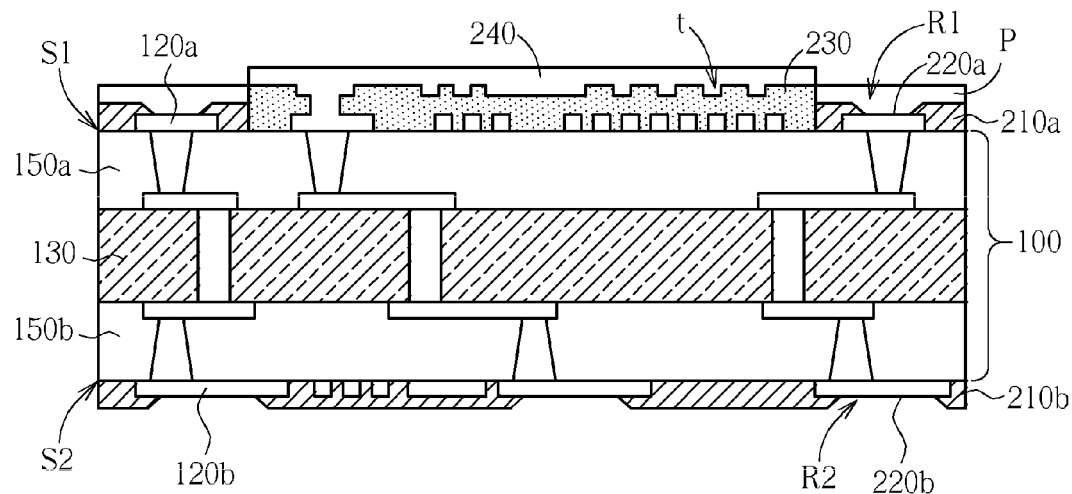
Figure 7:
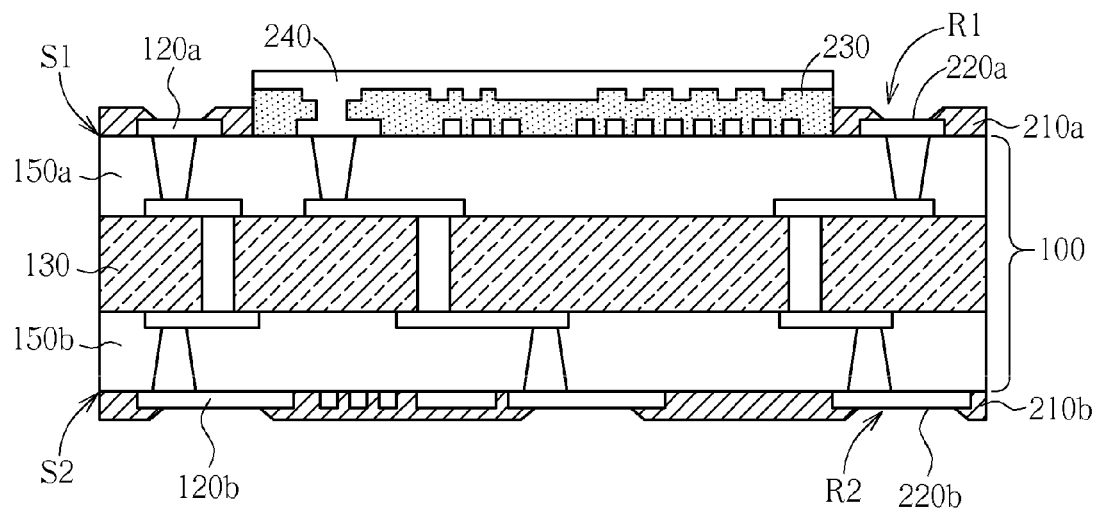
Figure 8:
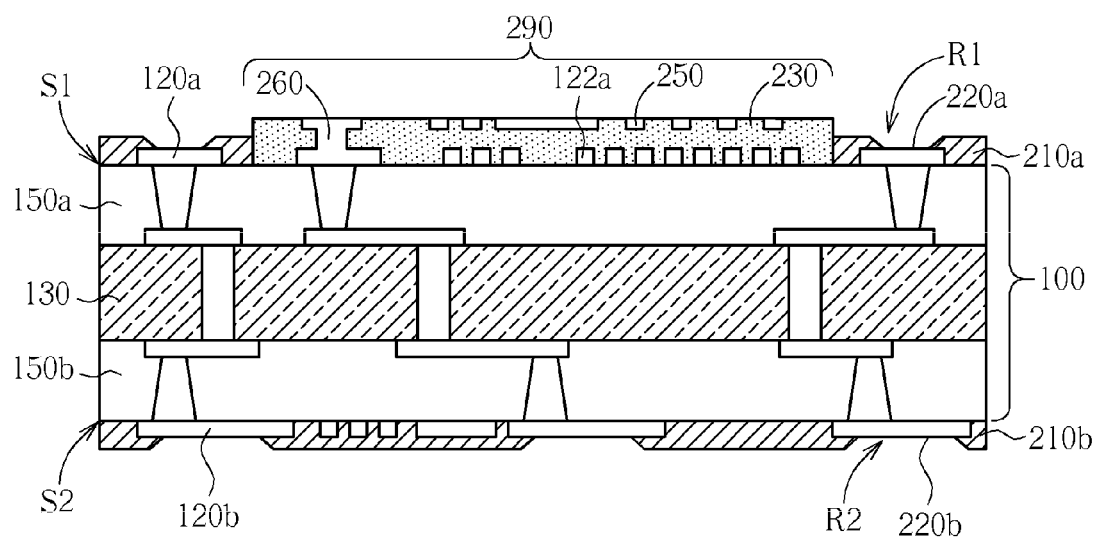

FIGS. 4-8 depict a method of forming a plurality of embedded bump pads in the top surface S3 of the insulation layer 230. As shown in FIG. 4, an anti-plating layer P is formed outside the chip mounting area A, wherein the materials of the anti-plating layer P may be an anti-copper plating dielectric material, but it is not limited thereto. The anti-plating layer P may be formed by methods such as printing. As shown in FIG. 5, a plurality of trenches t are formed in the top surface S3 of the insulation layer 230 by laser embedded (LE) technology. As shown in FIG. 6, a conductive layer 240 is filled into the trenches t, wherein the conductive layer 240 may be a copper layer, which may be filled in the trenches t by electroplating, but it is not limited thereto. As shown in FIG. 7, the anti-plating layer P is selectively peeled off to expose the solder mask 210a and the bump pad 220a under it. As shown in FIG. 8, the conductive layer 240 is planarized by methods such as a chemical mechanical polishing (CMP) process to form a plurality of embedded bump pads 250 and via plugs 260, wherein the embedded bump pads 250 and the interconnect circuit pattern 122a are electrically connected by the via plugs 260 in the insulation layer 230. In this way, the embedded bump pads 250, the interconnect circuit pattern 122a, the via plugs 260 and the insulation layer 230 constitute a fan-put interposer 290. The interposer 290 can be built-in and directly formed on a surface of the substrate 100 and integrated in package substrate processes.

Figure 9:
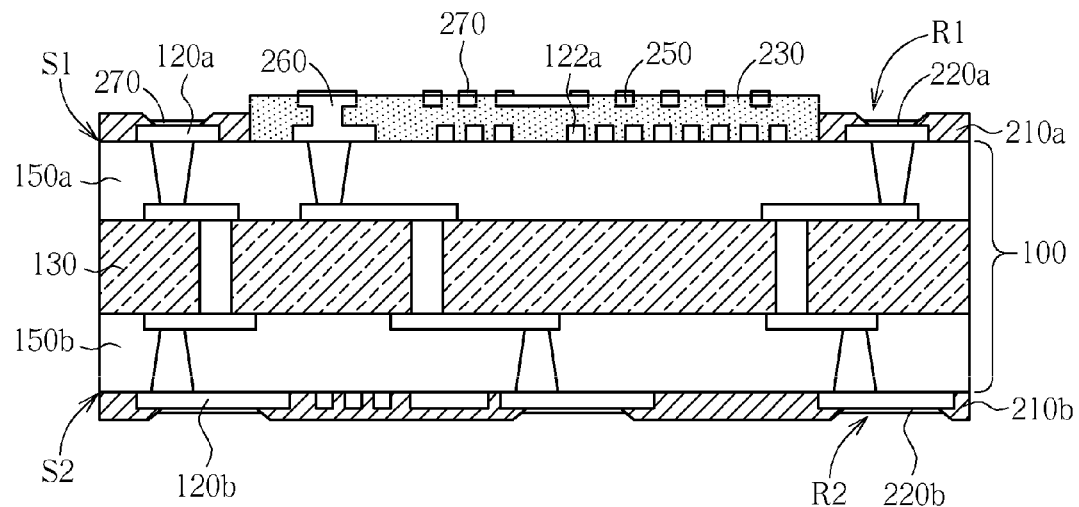

As shown in FIG. 9, after the conductive layer 240 is planaraized, a protection layer 270 may be formed on the surface of the embedded bump pads 250 to prevent the embedded bump pads 250 from contacting the atmosphere and being oxidized, wherein the protection layer 270 may include electroless nickel/electroless palladium/immersion gold (ENEPIG), electroless nickel/auto-catalytic gold (SNAG) or organic solderability preservative (OSP), etc.

Figure 10:
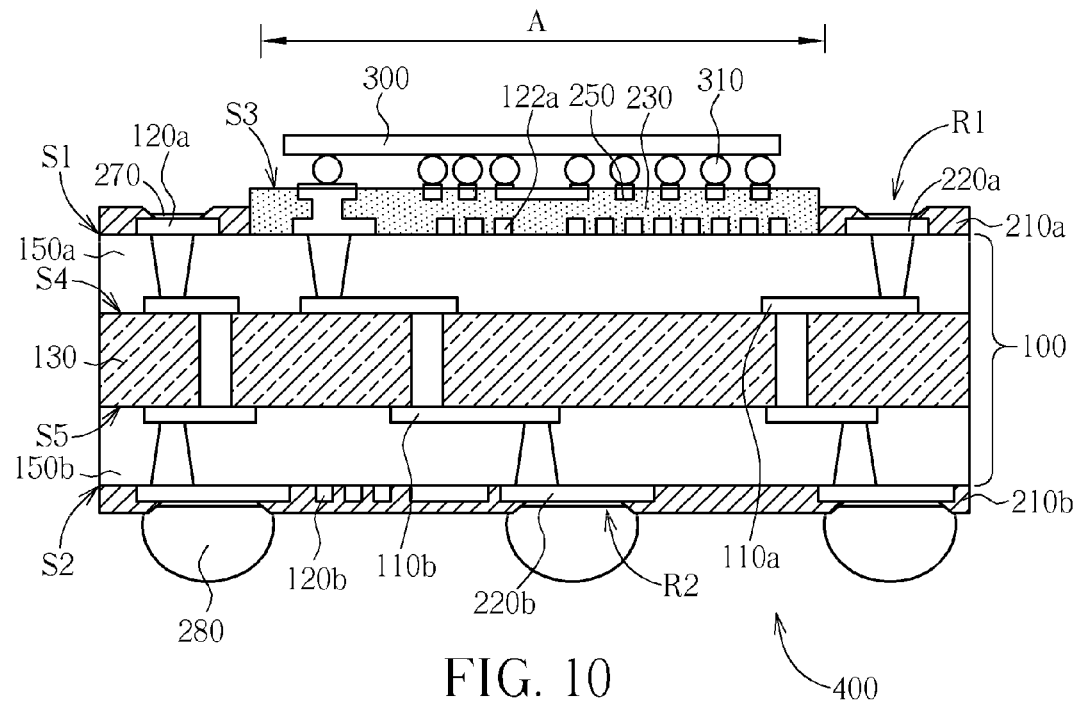

As shown in FIG. 10, the semiconductor chip 300 and the insulation layer 230 can be connected tightly by bonding the metal bumps or the solder bumps 310 of the semiconductor chip 300 with the embedded bump pads 250 and filling adhesive (not shown) between the insulation layer 230 and the semiconductor chip 300. Therefore a semiconductor package 400 is formed. That is, the semiconductor chip 300 is bonding with the substrate 100. In a preferred embodiment, the thermal expansion coefficient of the insulation layer 230 substantially matches the thermal expansion coefficient of the semiconductor chip 300. Furthermore, the semiconductor chip 300 can electrically connect the bump pads 220a by wire-bonding. A plurality of solder balls may be respectively disposed in the solder resist openings R2 and bond with the bump pads 220b.

The semiconductor package 400 may comprise an upper part and a lower part by using the core board 130 as a central axis. The upper part of the semiconductor package 400 may include the core board 130, the first dielectric layer 150a, the outer-layer circuit pattern 120a, the solder mask 210a and the insulation layer 230. The inner-layer circuit pattern 110a is disposed on a first surface S4 of the core board 130. The first dielectric layer 150a covers the inner-layer circuit pattern 110a. The outer-layer circuit pattern 120a is disposed on the first dielectric layer 150a and the outer-layer circuit pattern 120a includes an interconnect circuit pattern 122a located inside a chip mounting area A. The solder mask 210a may partially cover the outer-layer circuit pattern 120a outside the chip mounting area A. In another embodiment, the outer-layer circuit pattern 120a outside the chip mounting area A may be completely covered by the solder mask 210a. The insulation layer 230 covers the chip mounting area A and the interconnect circuit pattern. A plurality of embedded bump pads 250 are disposed in a top surface S3 of the insulation layer 230. Otherwise, the lower part of the semiconductor package 400 includes the core board 130, the inner-layer circuit pattern 110b, the second dielectric layer 150b, the outer-layer circuit pattern 120b, the solder mask 210b and a plurality of solder balls 280. The inner-layer circuit pattern 110b is disposed on a second surface S5 of the core board 130. The second dielectric layer 150b covers the inner-layer circuit pattern 110b. The outer-layer circuit pattern 120b is disposed on the second dielectric layer 150b. The outer-layer circuit pattern 120b includes a plurality of bump pads 220b. The solder mask 210b covers the second dielectric layer 150b and the outer-layer circuit pattern 120b, wherein the solder mask 210b includes a plurality of solder resist openings R2 respectively exposing a plurality of bump pads 220b. A plurality of solder balls 280 are respectively disposed in a plurality of solder resist openings R2 and respectively bond with a plurality of bump pads 220b.

Above all, the present invention provides a package substrate and fabrication method thereof, which applies an insulation layer having embedded circuit patterns as an interposer, replacing silicon sub-substrate or conventional external interposer of the prior art. Besides, the interposer of the present invention is directly fabricated and built-in on the substrate. In detail, the package substrate of the present invention applies laser embedded (LE) technology, thermal curing dielectric (TCD) technology and chemical mechanical polishing (CMP) technology. So, the problems of the width limitation of the semi-additive process of the prior art, the bad reliability caused by the large difference in CTE of the dielectric of the package substrate and the silicon substrate, the size shrinking limitation of the solder resist openings and the too large openings of blind holes leading to layout area wasting, can be solved. Therefore, the present invention can reduce the processing time and the processing cost. Besides, the package substrate of the present invention has smaller sizes and better reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package substrate, comprising:
    a core layer having a first circuit pattern on its first surface;
    a first dielectric layer covering the first circuit pattern;
    a second circuit pattern on the first dielectric layer, the second circuit pattern comprising an interconnect circuit pattern located in a chip mounting area;
    a first solder mask covering the second circuit pattern outside the chip mounting area, the first solder mask having a top surface;
    an insulation layer covering the chip mounting area and the interconnect circuit pattern; and
    a plurality of embedded bond pads disposed in a top surface of the insulation layer, wherein one of the plurality of embedded bond pads is electrically connected to the interconnect circuit pattern through a via plug in the insulation layer, and the interconnect circuit pattern, the via plug, and the insulation layer constitute an interposer, wherein the top surface of the insulating layer is higher than the top surface of the first solder mask.

2. The package substrate according to claim 1 wherein the insulation layer comprises thermal curing dielectric.

3. The package substrate according to claim 1 wherein the insulation layer is in direct contact with the first dielectric layer.

4. The package substrate according to claim 1 wherein the insulation layer has a thermal expansion coefficient matching that of a semiconductor chip.

5. The package substrate according to claim 1 further comprising a protection layer on each of the embedded bond pads.

6. The package substrate according to claim 1 further comprising:
    a third circuit pattern located on a second surface of the core layer;
    a second dielectric layer covering the third circuit pattern;
    a fourth circuit pattern on the second dielectric layer, the fourth circuit pattern comprising a plurality of bond pads;
    a second solder mask covering the second dielectric layer and the fourth circuit pattern, wherein the second solder mask comprises a plurality of solder resist openings that respectively expose the plurality of bond pads; and
    a plurality of solder balls disposed in the plurality of solder resist openings respectively to bond to the plurality of bond pads.

* * * * *

UNITED STATES PATENT AND TRADEMARK OFFICE
CERTIFICATE OF CORRECTION

| | | |
|---|---|---|
| PATENT NO. | : 8,604,359 B2 | Page 1 of 1 |
| APPLICATION NO. | : 13/241264 | |
| DATED | : December 10, 2013 | |
| INVENTOR(S) | : Tsung-Yuan Chen et al. | |

It is certified that error appears in the above-identified patent and that said Letters Patent is hereby corrected as shown below:

On the title page, item (30), the application number of the Foreign Application Priority Data should read --100120097--.

Signed and Sealed this
Twenty-fifth Day of February, 2014

Michelle K. Lee
*Deputy Director of the United States Patent and Trademark Office*